United States Patent
Miao et al.

(10) Patent No.: US 9,546,418 B2
(45) Date of Patent: Jan. 17, 2017

(54) DIFFUSION-BONDED SPUTTER TARGET ASSEMBLY AND METHOD OF MANUFACTURING

(75) Inventors: Weifang Miao, Columbus, OH (US); David B. Smathers, Columbus, OH (US); Eugene Y. Ivanov, Grove City, OH (US); Erich Theado, Columbus, OH (US); Robert S. Bailey, Grove City, OH (US); Jeff Hart, Columbus, OH (US)

(73) Assignee: Tosoh SMD, Inc., Grove City, OH (US)

( * ) Notice: Subject to any disclaimer, the term of this patent is extended or adjusted under 35 U.S.C. 154(b) by 515 days.

(21) Appl. No.: 13/984,961

(22) PCT Filed: Feb. 9, 2012

(86) PCT No.: PCT/US2012/024469
§ 371 (c)(1),
(2), (4) Date: Oct. 18, 2013

(87) PCT Pub. No.: WO2012/112376
PCT Pub. Date: Aug. 23, 2012

(65) Prior Publication Data
US 2014/0034490 A1 Feb. 6, 2014

Related U.S. Application Data

(60) Provisional application No. 61/442,427, filed on Feb. 14, 2011.

(51) Int. Cl.
*C23C 14/24* (2006.01)
*C23C 14/34* (2006.01)
*H01J 37/34* (2006.01)

(52) U.S. Cl.
CPC ....... *C23C 14/3414* (2013.01); *C23C 14/3407* (2013.01); *H01J 37/3414* (2013.01);
(Continued)

(58) Field of Classification Search
CPC . H01J 37/3435; H01J 37/3414; H01J 37/3423
See application file for complete search history.

(56) References Cited

U.S. PATENT DOCUMENTS

| 3,657,801 | A | 4/1972 | Hershenson |
| 4,341,816 | A | 7/1982 | Lauterbach et al. |

(Continued)

FOREIGN PATENT DOCUMENTS

| CN | 101338408 A | 1/2009 |
| CN | 101542011 A | 9/2009 |

(Continued)

OTHER PUBLICATIONS

The First Office Action issued by the The People's Republic of China, Issued in Chinese Patent Application No. 201280018352.9 on Jan. 12, 2015.

(Continued)

*Primary Examiner* — Jason M Berman
(74) *Attorney, Agent, or Firm* — Wegman, Hessler & Vanderburg

(57) ABSTRACT

A method of making a diffusion bonded sputter target assembly is provided. A target blank comprising a first metal or alloy has a first surface defining a sputtering surface and a second surface. A second metal or alloy is placed around the target blank. A backing plate is provided adjacent the second metal or alloy that is positioned alongside of the second target surface. This assembly is then diffusion bonded, and a portion of the second metal overlying the sputtering surface of the target is removed to expose the target sputtering surface. W target or W alloy target/Ti or Ti (Continued)

alloy backing plate assemblies are provided with an Al interlayer positioned intermediate the W or W alloy target and backing plate. The assembly has a bond strength exceeding 50 MPa.

13 Claims, 1 Drawing Sheet

(52) U.S. Cl.
CPC ...... *H01J 37/3423* (2013.01); *H01J 37/3426* (2013.01); *H01J 37/3435* (2013.01)

(56) References Cited

U.S. PATENT DOCUMENTS

| | | | |
|---|---|---|---|
| 5,096,518 A | | 3/1992 | Fujikawa et al. |
| 5,397,050 A | | 3/1995 | Mueller |
| 5,522,976 A | | 6/1996 | Campet et al. |
| 5,693,203 A | * | 12/1997 | Ohhashi ............... C23C 14/3407 |
| | | | 204/298.12 |
| 5,863,398 A | | 1/1999 | Kardokus et al. |
| 6,073,830 A | | 6/2000 | Hunt et al. |
| 6,085,966 A | | 7/2000 | Shimomuki et al. |
| 6,183,613 B1 | | 2/2001 | Gilman et al. |
| 6,183,686 B1 | | 2/2001 | Bardus et al. |
| 6,428,663 B1 | | 8/2002 | Mostovoy et al. |
| 6,555,250 B2 | | 4/2003 | Shah et al. |
| 6,579,431 B1 | | 6/2003 | Bolcavage et al. |
| 6,619,537 B1 | * | 9/2003 | Zhang ................. B23K 20/002 |
| | | | 204/298.12 |
| 6,708,870 B2 | | 3/2004 | Koenigsmann et al. |
| 6,759,143 B2 | | 7/2004 | Oda et al. |
| 6,984,358 B2 | | 1/2006 | Spencer |
| 7,837,929 B2 | | 11/2010 | Gaydos et al. |
| 2003/0121777 A1 | * | 7/2003 | Sato ..................... C23C 4/00 |
| | | | 204/298.12 |
| 2003/0134143 A1 | | 7/2003 | Oda et al. |
| 2005/0029094 A1 | * | 2/2005 | Watanabe ........... C23C 14/3414 |
| | | | 204/298.13 |
| 2008/0041720 A1 | | 2/2008 | Kim et al. |
| 2008/0149477 A1 | | 6/2008 | Lo et al. |
| 2008/0271779 A1 | | 11/2008 | Miller et al. |
| 2009/0078570 A1 | | 3/2009 | Yi et al. |
| 2009/0134020 A1 | | 5/2009 | Suzuki et al. |
| 2009/0173626 A1 | | 7/2009 | Duckham et al. |
| 2009/0229975 A1 | | 9/2009 | Yamakoshi |
| 2010/0012488 A1 | | 1/2010 | Koenigsmann et al. |
| 2010/0038241 A1 | | 2/2010 | Ivanov |
| 2010/0108500 A1 | | 5/2010 | Hawrylchak et al. |

FOREIGN PATENT DOCUMENTS

| | | |
|---|---|---|
| EP | 2 145 976 A1 | 1/2010 |
| EP | 2 806 048 A2 | 11/2014 |
| JP | 63-270459 | 11/1988 |
| JP | H 6-108246 | 4/1994 |
| JP | H 9-059770 | 3/1997 |
| JP | H 11511206 A | 9/1999 |
| JP | 2002-129316 | 5/2002 |
| JP | 2002-146524 A | 5/2002 |
| JP | 4193947 B2 | 12/2008 |
| WO | WO 97/07258 A1 | 2/1997 |
| WO | WO 98/26107 A1 | 6/1998 |
| WO | WO 2008/096648 A1 | 8/2008 |

OTHER PUBLICATIONS

Comments of the Examiner and Search Report issued by the The People's Republic of China, Issued in Chinese Patent Application No. 201280018352.9 on Jan. 12, 2015.
International Search Report and Written Opinion mailed Jun. 29, 2012 for PCT/US2012/024469 filed Feb. 9, 2012.
International Preliminary Report on Patentability mailed Aug. 29, 2013 for PCT/US2012/024469 filed Feb. 9, 2012.
English Translation of Notice of Reasons for Rejection issued Aug. 25, 2015 in Japanese Patent Application No. 2013-553562.
The Second Office Action issued by the The People's Republic of China, Issued in Chinese Patent Application No. 201280018352.9 on Aug. 20, 2015.
Comments of the Examiner and Search Report issued by the The People's Republic of China, Issued in Chinese Patent Application No. 201280018352.9 on Aug. 20, 2015.
Decision of Refusal and English Translation issued Apr. 19, 2016 in Japanese Patent Application No. 2013-553562.

* cited by examiner

DIFFUSION-BONDED SPUTTER TARGET ASSEMBLY AND METHOD OF MANUFACTURING

CROSS REFERENCE TO RELATED APPLICATION

This application claims the priority benefit of U.S. Provisional Patent Application Ser. No. 61/442,427 filed Feb. 14, 2011.

FIELD OF THE INVENTION

The present application pertains to methods and structural combinations that provide diffusion bonding (DB) of a sputtering target to a backing plate wherein the target and backing plate may have different coefficients of thermal expansion (CTE).

BACKGROUND OF THE INVENTION

Cathodic sputtering is widely used for the deposition of thin layers of materials onto desired substrates. Basically, this process requires gas ion bombardment of a target having a sputtering surface formed of a material that is to be deposited as a thin film or layer on a substrate. Ion bombardment of the target not only causes atoms or molecules of the target material to be sputtered, but imparts considerable thermal energy to the target. This heat is dissipated by use of a cooling fluid typically circulated beneath or around a heat conducting backing plate that is positioned in heat exchange relation with the target.

The target forms a part of a cathode assembly which together with an anode is placed in an evacuated chamber that contains an inert gas, preferably argon. A high voltage electrical field is applied across the cathode and anode. The inert gas is ionized by collision with the electrons ejected from the cathode. Positively charged gas ions are attracted to the cathode and, upon impingement with the target surface, dislodge the target material. The dislodged target materials traverse the evacuated enclosure and deposit as a thin film on the desired substrate that is normally located proximate the anode.

In addition to the use of an electrical field, increasing sputtering rates have been achieved by the concurrent use of an arch-shaped magnetic field that is superimposed over the electrical field and formed in a closed loop configuration over the surface of the target. These methods are known as magnetron sputtering methods. The arch-shaped magnetic field traps electrons in an annular region adjacent the target surface thereby increasing the number of electron-gas atom collisions in the area to produce an increase in the number of positively charged gas ions in the region that strike the target to dislodge the target material. Accordingly, the target material becomes eroded (i.e., consumed for subsequent deposition on the substrate) in a generally annular section of the target face, known as the target raceway.

In conventional target cathode assemblies, the target is attached to a nonmagnetic backing plate. The backing plate is normally water-cooled to carry away the heat generated by the ion bombardment of the target. Magnets are typically arranged beneath the backing plate in positions such that the above-noted magnetic field forms the shape of a loop or tunnel extending around the exposed face of the target.

There has been a growing interest in sputtering target assemblies with increasingly different thermal expansion coefficients between the target material and the backing plate material. Although sputtering target assemblies may be made by solder bonding backing plates of various materials to a target, solder bonding has the disadvantage of not being able to withstand high power sputtering applications. Thus, diffusion bonded sputtering target assemblies are preferred.

Diffusion bonds are produced by pressing the surfaces into contact while applying heat to induce metallurgical joining and diffusion to varying extent across the bond interface. A variety of different metal combinations may be used as bonding aids. These metals are applied as coatings to one or more of the DB interfacial surfaces to promote DB bonding and may be applied via conventional electroplating, electroless plating, vacuum cadmium plating, physical vapor deposition, or other techniques. In some cases, a metal foil is positioned between the surfaces to be joined by DB. Commonly, the surfaces to be joined are prepared by chemical or other means to remove oxides or their chemical films which may interface with the bonding process.

Diffusion bonding techniques include hot isostatic pressing (HIP) and uniaxial hot pressing (UHP). In UHPing, the target and backing plate are placed between a pair of platens, or the like, in a chamber which provides for careful control of temperature, pressure and other atmospheric conditions. The controlled atmosphere may be that of a vacuum, inert, or reducing gas. The assembly is heated to a temperature that is below that of the lower melting member of the target/backing plate combination. As the assembly is heated, pressure is applied by the platens acting in a uniaxial direction. The assembly is maintained in the control chamber until a strong DB bond is formed.

In the HIPing process, the target/backing plate assembly is placed within a canister. A vacuum is drawn on the canister and then it is placed in a HIPing chamber. An argon or helium atmosphere is charged into the canister and temperature and pressure are increased. The HIPing canister is subjected to pressure from all sides. As in the UHPing process, the temperature approaches the melting joint of the lower melting member of the target/backing plate combination. Then, the HIPed assembly is maintained at the desired temperature, pressure, and atmospheric conditions to form a strong DB bond.

After bonding has occurred, the assembly is cooled. The cooled target usually bows or deflects to one direction. This deflection is usually caused by unequal shrinkage or expansion of the target and backing plate due to the differing CTE of each. Cracking of the bond between the target and backing plate, or delamination may also occur during cooling. In addition, the different CTE materials render the assembly susceptible to other stresses, degradations or distortions during the high temperatures that occur during sputtering. To remove the deflection and create a "flat" assembly target surface, the target is typically flattened mechanically.

This diffusion bonding and subsequent flattening process is suitable for ductile targets such as titanium or tantalum. For brittle targets such as tungsten, however, the likelihood of delamination is greater throughout the process. The bond strengths between the layers of such target assemblies are typically less than 45 MPa.

BRIEF DESCRIPTION OF THE INVENTION

In accordance with one aspect of the invention, a method is provided for making a target/backing plate assembly. A target blank of a first metal or alloy is provided with the blank having a first surface defining a sputtering surface during the sputtering operation and an opposed second surface. A second metal or alloy is placed alongside the first and second target surfaces. A backing plate and placed adjacent the second metal or alloy that is positioned alongside the second target surface. The target, second metal, and backing plate thereby define a combined assembly.

In accordance with one preferred embodiment, the combined assembly of target, second metal, and backing plate is diffusion bonded to form a diffusion bonded assembly. Then, at least a portion of the second material alongside the sputtering surface of the target is removed to thereby expose at least a portion of the sputtering surface.

In certain embodiments of the invention, the target is W or alloy thereof, and the first and second surfaces of the target may be coated with an optional thin layer of Ti, Ni, or Cr prior to the step of placing the second metal or alloy alongside the first and second target surfaces.

In other embodiments, the second metal or alloy comprises a metal having a modulus of elasticity in tension of less than or equal to $8.2 \times 10^4$ MPa, and the backing plate may have a coefficient of thermal expansion of less than or equal to $23.0 \times 10^{-6}$ m/m/K. In certain instances, the second metal or alloy comprises Al or Al alloys such as Al 6061 or Al 1100.

In one embodiment, the backing plate may comprise Ti or Ti alloy. In other embodiments, the backing plate may comprise Ti, Zr, Mo, Nb, or Ta and alloys thereof.

In one exemplary embodiment, the second metal or alloy comprises a pair of plates. The first of the pair is placed adjacent the first surface (sputtering surface) of the target, and the second of the pair is placed adjacent the second surface of the target, thereby forming a sandwich construction of the target blank and the plates. The plates composed of the second metal or alloy may be Al or Al alloy.

In yet other embodiments, the thickness of each of the plates composed of the second metal or alloy has a thickness of about 0.1-1.0 x wherein x is the thickness of the target blank.

The target, second metal encapsulating the target, and backing plate assembly may be diffusion bonded at temperatures of between about 400-600° C. and at a pressure of not less than about 5 ksi. This diffusion bonding step may be provided in a one-step process or in a two-step process. In the two-step process, a first step comprises diffusion bonding of the target blank and second metal or alloy to form a combination, and then a second step comprises diffusion bonding of the combined target/second metal combination with the backing plate. In certain cases, the second step may be conducted at a temperature different from the temperature used in the first step.

In other embodiments, the target may be W alloyed with Ta, Ti, or Si.

In other aspects, the invention is directed toward a diffusion bonded W target/backing plate assembly. The assembly further includes an interlayer positioned intermediately between the W target and the backing plate. The backing plate may comprise Ti or Ti alloy, and the inner layer comprises Al or Al alloy. This assembly has a bond strength exceeding 50 MPa. In other embodiments, the bond strength exceeds 68.94 MPa (10 ksi).

In still further embodiments, the target has a density in excess of 99.7%, a grain size of less than 100 µm, an oxygen content of less than 100 ppm, a carbon content of less than 30 ppm, and the purity of the W may be 99.999% and greater.

In further embodiments, the target assembly comprises an exposed W target face. By this, it is meant that the face of the sputtering target has been exposed after performance of the processes above described so as to leave an adequate sputtering surface. Further, the assembly may comprise a sidewall portion having exposed Al or Al alloy and exposed Ti or Ti alloy surfaces thereof. A coating formed from the sputtering material is provided along the sidewall via conventional techniques such as plasma coating. This coating may have, for example, a thickness of about 0.001-0.020 inches. The interlayer may, for example, be Al 6061 or Al 1100, and the bond strength of the overall diffusion bonded assembly may exceed 60 MPa.

DETAILED DESCRIPTION OF EXEMPLARY EMBODIMENTS

It has been surprisingly discovered that encapsulating brittle targets with a second material during the DB process produces diffusion-bonded sputtering target assemblies with bond strengths between the layers of equal to, or greater than 45 MPa.

Figure 1:
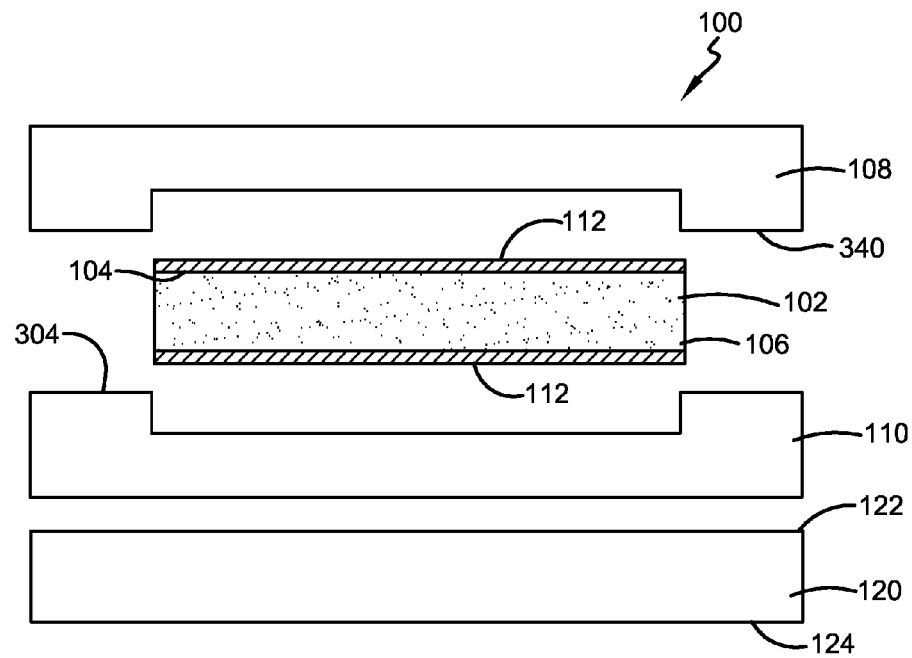
FIG. 1 is a schematic illustration showing one embodiment of the method with individual elements of the target assembly shown prior to diffusion bonding.

Turning now to FIG. 1, there is shown a diffusion bonded target backing plate assembly 100 in its pre-assembled state. The assembly comprises target blank 102 comprised of a first metal or alloy such as W. The target comprises a first or top surface 104 that will serve as a sputtering surface upon completion of the assembly. The target blank also includes an opposed bottom surface 106. An optional thin coating 112 can be applied to both surfaces of the target if desired. This coating layer may be comprised of Ti, Ni, or Cr and can be deposited on the target blank surfaces via conventional techniques.

As shown in FIG. 1, a second metal or alloy is provided in the form of a pair of opposed plates 108,110 with the plates to be sandwiched about the intermediately disposed target blank 102. The plates 108,110 are placed alongside the respective opposed surfaces of the target such that the first plate 108 is disposed adjacent sputtering surface 104 of the target blank, and the plate 110 is placed alongside the bottom surface 106 of the target and its optimal thin coating layer 112.

As shown, each of the plates 108,110 is provided with vertically extending flanges 340, 304 respectively that in one exemplary embodiment mate with the flange from the other one of the pair of plates. The plates may however just as easily be flat with no flanges depending therefrom.

As further shown in FIG. 1, a backing plate 120 is also one of the assembly components, and this backing plate has a top surface 122 adapted to interfacially mate with the bottom surface of the plate 110 composed of the second metal or alloy. As shown, the lower or bottom surface 124 of the backing plate 120 is exposed and is adapted for heat exchange contact with a cooling medium, such as water, typically used in cathodic sputter operations to help cool the target.

Figure 2:
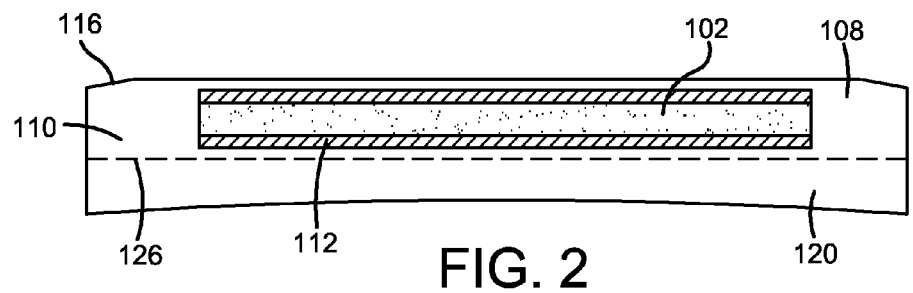
FIG. 2 is a schematic illustration of the embodiment shown in FIG. 1 with the elements of the target assembly shown after diffusion bonding.

Turning now to FIG. 2, the assembly is shown after it has been subjected to a diffusion bonding operation of the aforementioned types. Here, the target can be seen surrounded or encapsulated within a matrix of the second metal or alloy comprised of the two plates 108,110. The second metal or alloy, in turn, is diffusion bonded to the underlying backing plate along interfacial boundary 126. The overall assembly 100 can be provided with a slight chamfer 116 so as to facilitate insertion of the assembly into mechanical devices that are adapted to remove portions of the second metal or alloy 108 (and optional coating 112) adjacent the sputtering surface of the target blank. At present, it is preferred to machine away the metal or alloy 108 to expose at least a portion of the sputtering surface 104 of the target blank.

Figure 3:
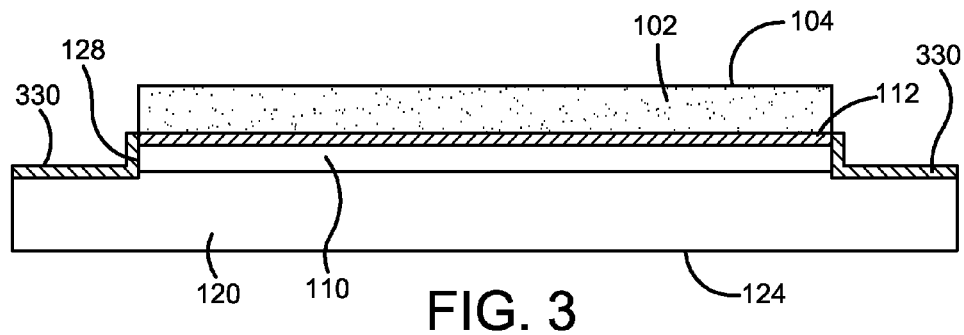
FIG. 3 is a schematic illustration of the embodiment shown in FIGS. 1 and 2 with the elements shown in a final assembly after finishing.

FIG. 3 shows the finished assembly having an exposed sputtering surface 104. A sidewall area 128 is shown around the periphery of the target/second metal 110 interface. If desired, a thin coating 330 of the target material may be placed over the exposed metals at this sidewall so as to help prevent unintended sputtering of the second metal and/or backing plate during the coating operation. The coating can be applied by conventional methods such as plasma coating and can be on the order of 0.001-0.020 inches in thickness.

In one embodiment of the method, the second metal or metal plates are formed from a material with a modulus of elasticity in tension of less than or equal to about $8.2 \times 10^4$ MPa. Further, the backing plate may be formed from a material with a coefficient of thermal expansion of less than or equal to $23.0 \times 10^{-6}$ m/m/K.

In one exemplary embodiment, the target blank is placed between the plates 108,110. The components are diffusion bonded to form a diffusion-bonding sputtering target assembly that is then mechanically and/or chemically finishing to expose the target sputtering surface.

The target blank may comprise one or more of the materials selected from the group consisting of W, Ta, Ti, Si and alloys thereof.

In another embodiment, one or more of the plates 108,110 may comprise one or more of the materials selected from the group consisting of Al and Al alloys. In another method, each plate 108,110 has a thickness ranging from about 0.1 to about 1 times the thickness of the target ingot.

In another embodiment, the target blank is pre-treated with a bonding aid by coating the surface of the plate with a thin layer coating 112 composed of one or more materials selected from the group consisting of Ti, Ni, Cr, and alloys thereof. The pre-treatment step occurs prior to encapsulating the target ingot within the plates.

In another embodiment, the backing plate comprises one or more of the materials selected from the group consisting of Ti, Zr, Mo, Nb, Ta, and alloys thereof.

In yet another embodiment, one or more sidewalls of the finished assembly are coated with the sputtering material. In another embodiment, this coating 112 has a thickness ranging from about 0.001 to about 0.020 inches. The coating may be applied using a plasma spray method.

In another embodiment, a diffusion-bonded sputtering target assembly (DBSTA) is disclosed comprising an exposed target sputtering surface and a backing plate, wherein the exposed target ingot and the backing plate are separated by, and diffusion bonded to, an interlayer.

Another embodiment discloses a diffusion bonded sputter target assembly (DBSTA) wherein the target blank comprises one or more of the materials selected from the group consisting of W, Ta, Ti, Si and alloys thereof. In another embodiment, the backing plate comprises one of more of the materials selected from the group consisting of Ti, Zr, Mo, Nb, Ta, and alloys thereof. In yet another embodiment, the interlayer comprises one or more of the materials selected from the group consisting of aluminum and aluminum alloys. The interlayer may have a thickness ranging from about 0.1 to about 1 times a thickness of the target blank thickness.

In another embodiment, a DBSTA is disclosed wherein the bond strength between the target and the interlayer and between the interlayer and the backing plate is equal to or greater than about 45 MPa. In yet another embodiment, the bond strength between the DBSTA is equal to or greater than about 60 MPa.

EXAMPLES

Example 1

A diffusion bonded sputtering target assembly was made by a method comprising the steps of encapsulating a W blank by contacting a top side of the blank with an Al 1100 metal plate and contacting a bottom side of the blank with an Al 1100 plate to form a W plate "sandwiched" between the two Al 1100 plates. The bottom side of the sandwich was superposed over a Ti backing plate. The W target blank, Al 1100 plates, and Ti backing plate were diffusion bonded at temperatures ranging from 400 to 600° C. and pressures greater than or equal to 34 MPa to form a sputtering target assembly intermediate. Then, the assembly was machined to remove the Al layer that covered the sputtering surface of the target.

The diffusion bonded sputtering target assembly of Example 1 was tested in a sputtering device. The target survived 100 kWh while at a maximum sputtering power of 17 kWh. After sputtering, the target was measured for deflection and bond strength. The deflection on the back side of the target assembly was approximately 0.005 inches. The W—Al 1100 bond strength was measured to be between 46 and 55 MPa.

Example 2

A diffusion bonded sputtering target assembly was made as in Example 1, where after finishing, the sidewalls of the target were coated with W by plasma spray.

Example 3

A diffusion bonded sputtering target assembly was made as in Example 1, but Al 6061 was substituted for Al 1100. The W—Al 6061 bond strength was measured to be greater than 60 MPa.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. For example, although the embodiment discloses diffusion bonding the target, second metal plates, and the backing plate all in one step, the diffusion process may include multiple steps. Such other examples are intended to be within the scope of the claims if they have structural elements that do not differ from the literal language of the claims, or if they include equivalent structural elements with insubstantial differences from the literal languages of the claims.

What is claimed is:

1. A method of making a target/backing plate assembly comprising:
    (a) providing a target blank of a first metal or alloy, said target blank having a first surface defining a sputtering surface, and a second surface;
    (b)(i) providing a second metal or alloy and (ii) placing said second metal or alloy alongside said first and second target surfaces;
    (c)(i) providing a backing plate and (ii) placing said backing plate adjacent said second metal or alloy that is positioned alongside said second target surface; said target blank, second metal and backing plate thereby defining a combined assembly;
    (d) diffusion bonding said combined assembly to form a diffusion bonded assembly; and
    (e) removing at least a portion of said second metal alongside said sputtering surface of said target thereby exposing at least a portion of said sputtering surface.

2. Method as recited in claim 1 wherein said target is W or alloy thereof and wherein said first and second surfaces of said target are coated with a thin layer of Ti, Ni, or Cr prior to said step (b)(ii).

3. Method as recited in claim 1 wherein said target is W or alloy thereof and wherein said second metal or alloy comprises a metal having modulus of elasticity in tension of less than or equal to $8.2 \times 10^4$ MPa, and wherein said backing plate has a coefficient of thermal expansion of less than or equal to $23.0 \times 10^{-6}$ m/m/K.

4. A method as recited in claim 3 wherein said second metal or alloy comprises Al or Al alloy.

5. A method as recited in claim 4 wherein said backing plate comprises Ti or Ti alloy.

6. A method as recited in claim 1 wherein said second metal or alloy comprises a pair of plates, a first of said pair being placed adjacent said first surface of said target and a second of said pair being placed adjacent said second surface of said target thereby forming a sandwich construction of said target blank and said plates.

7. A method as recited in claim 3 wherein said backing plate comprises Ti, Zr, Mo, Nb, or Ta and alloys thereof.

8. A method as recited in claim 6 wherein said pair of plates is composed of Al or Al alloy.

9. A method as recited in claim 8 wherein each of said pair of plates has a thickness of between about 0.1-1 x wherein x is the thickness of said target blank.

10. A method as recited in claim 1 wherein said step (d) is conducted at a temperature of between about 400-600° C. and at a pressure of not less than 5 ksi.

11. A method as recited in claim 1 wherein said step (d) is performed in a one-step process.

12. A method as recited in claim 1 wherein said step (d) is a two-step process wherein a first step comprises diffusion bonding of said target blank and said second metal or alloy to form a combination and a second step comprises diffusion bonding of said backing plate to said target blank/second metal combination, said second step being conducted at a temperature different from a temperature used in said first step.

13. A method as recited in claim 3 wherein said W is alloyed with Ta, Ti, or Si.

* * * * *